United States Patent [19]

Shaw

[11] Patent Number: 4,779,877

[45] Date of Patent: Oct. 25, 1988

[54] WAFER SUPPORT ASSEMBLY

[75] Inventor: R. Howard Shaw, Palo Alto, Calif.

[73] Assignee: Varian Associates, Inc., Palo Alto, Calif.

[21] Appl. No.: 154,537

[22] Filed: Feb. 12, 1988

Related U.S. Application Data

[63] Continuation of Ser. No. 855,030, Apr. 22, 1986, abandoned.

[51] Int. Cl.[4] ............................................. B23B 5/22
[52] U.S. Cl. ...................................... 279/4; 118/503; 269/254 R; 279/106
[58] Field of Search .................. 269/254 R, 275, 287; 279/35-37, 23 R, 106, 109, 4; 118/503; 248/176, 302, 316.7

[56] References Cited

U.S. PATENT DOCUMENTS

| | | | |
|---|---|---|---|
| 4,306,731 | 12/1981 | Shaw | 279/4 |
| 4,311,427 | 1/1982 | Coad et al. | 414/217 |
| 4,350,116 | 9/1982 | Grandia et al. | 118/503 X |

Primary Examiner—Gil Weidenfeld
Assistant Examiner—Steven C. Bishop
Attorney, Agent, or Firm—Stanley Z. Cole, Kenneth L. Warsh, Peter J. Sgarbassa

[57] ABSTRACT

An assembly is provided for supporting semiconductor wafers individually within a support while permitting processing of both faces of a wafer as well as facilitating rapid insertion and removal of wafers into the support. Each assembly includes a wire clip having an arcuate tip used to grasp the wafer. The wire clip can be moved in two planes by actuating mechanisms, thereby moving the clip out of the plane of wafer processing and facilitating loading in the wafer processing plane.

3 Claims, 3 Drawing Sheets

U.S. Patent    Oct. 25, 1988    Sheet 3 of 3    4,779,877
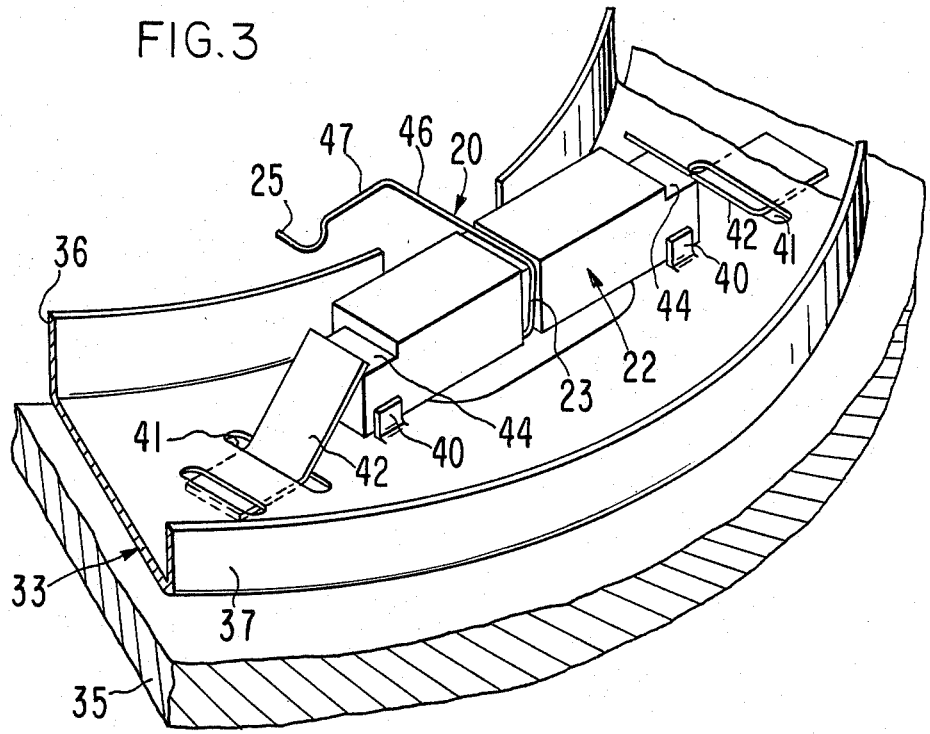
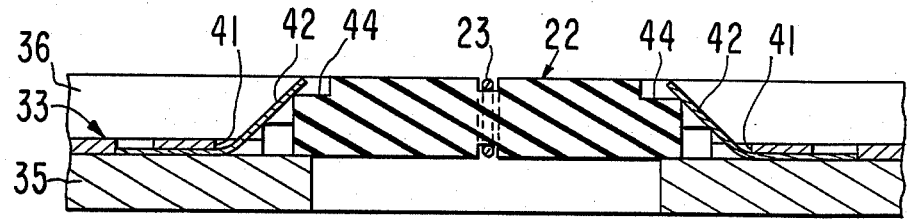
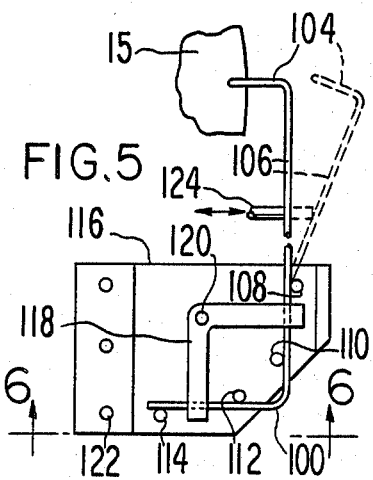
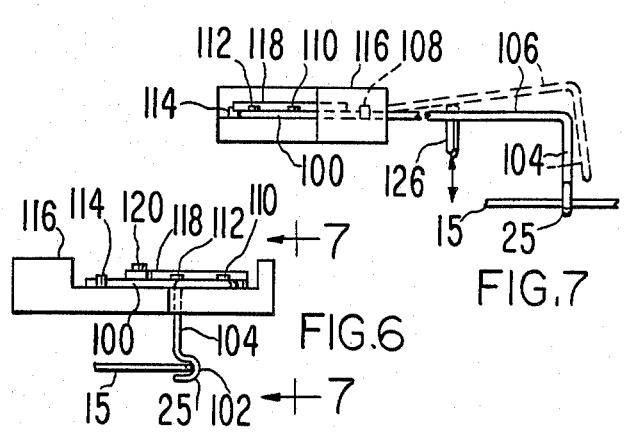

WAFER SUPPORT ASSEMBLY

This application is a continuation of application Ser. No. 855,030, filed 4/22/86, now abandoned.

FIELD OF THE INVENTION

This invention relates to apparatus for facilitating individual mechanical handling and transport of thin substrates, and more particularly to apparatus for protectively supporting within a frame individual semiconductor wafers in a manner permitting processing on both sides thereof, easy insertion and removal of wafers, and transport between processing stations and between cassettes with minimal risk of damage and contamination of the wafer.

BACKGROUND OF THE INVENTION

The semiconductor wafers with which this invention deals are of the type from which a very large plurality of individual electronic micro circuits or components are made using well-known coating, masking and impurity introduction techniques. Such wafers are highly fragile and easily damaged, because of their thinness (of the order of 10-20 mils), large diameter (2 to 6 inches), highly polished faces and microscopic surface steps and grooves. These wafers can be rendered useless for device fabrication by any of many kinds of contamination, abrasion or damage, even minute scratches. Therefore, extraordinary care in handling is called for, and in particular it is highly desirable to support and transport wafers in a manner which minimizes hand and machine contact therewith, and any mechanical shock or abrasion.

Previous expedients for handling and transport of wafers have ranged from the very primitive to the overly complex, and have included simple platens or sleds on which wafers are laid horizontally and transported, for example by moving conveyor belts or chains, linear air bearings or tracks, clip supports of various designs, and cassettes. All of these expedients have necessitated a fairly large degree of handling and loading by technicians, and have been more or less difficult to make compatible with automated transports and means for loading and unloading at many of the necessary wafer processing stations particularly those involving the need to transport wafers into and from a vacuum environment. Elaborate load locks and loading apparatus have been necessitated, or further manual handling at such stations. Such disadvantages have been one key factor inhibiting extensive adoption of individual wafer processing on a continuous serial basis, as opposed to batch loading and processing.

Other disadvantages of these prior expedients have been at least as serious. Many have not held the wafers positively during movement, stops, or other shocks, with the result that the wafers undergo movement relative to other parts, giving rise to damage. Other expedients, while providing more positive support, have cut yields by engaging the wafers over some portion of their surface area, or failed to position the wafer consistently in a predetermined position, or become unreliable when faced with wafers whose diameters vary due to presently unavoidable normal manufacturing tolerances. Most support expedients have not permitted processing of both sides of the wafer, nor provided any positive protection against contact with other parts, nor tolerated processing equipment being applied to the wafer without risking its dislodgement from the transport means, nor readily accommodated to highly simplified automated loading.

Clips of the prior art as described in U.S. Pat. No. 4,306,731 to the same inventor, assigned in common with this patent, are used in very tight geometry, which results in close tolerances. Such clips are made of strip material, are difficult to manufacture and are highly stressed. Because the clips are highly stressed, the temperature to which these clips are exposed must be limited to prevent annealing the spring material. In addition, the wafers must be oriented so flats do not engage the clips, as clip deflection is too small to accommodate such a situation.

OBJECTS OF THE INVENTION

Accordingly, an object of the invention is to provide a wafer support assembly positively holding a wafer within a framework while allowing processing on both sides.

Another object of the invention is to provide such support assembly supporting the wafer positively and resiliently, yet facilitating quick removal and insertion of a wafer therewithin.

A further object of the invention is to provide a wafer support assembly allowing processing equipment to contact resiliently the wafer while continuing to positively support the wafer against dislodgement.

Still another object of the invention is to provide wafer support assembly which, while allowing processing thereof on both sides, positively protects the wafer against rubbing contact with other members during transit thereof.

A further object of the invention is to provide a wafer support assembly which reliably supports wafers of slightly different diameters individually against damage due to shocks, vibrations and the motions entailed in transport between various processing stations.

A still further object of the invention is to provide a wafer support assembly which facilitates transferral of a wafer into and from processing stations within a vacuum environment.

Yet a further object of the invention is to provide wafer support apparatus enabling the wafer to be transported and supported in horizontal, vertical or other orientations.

A related object of the invention is to provide a wafer support apparatus which is readily disassembled for maintenance, cleaning and replacement of parts.

Yet another object of the invention is to provide a wafer support assembly which readily provides electrical isolation for the wafer.

SUMMARY OF THE INVENTION

In accordance with the invention, wafer support and transport apparatus protectively supporting wafers individually during processing while facilitating loading and unloading of same and enabling both faces to be processed is provided. Such apparatus comprises a plate-like support provided with an aperture of diameter larger than the wafer, and a plurality of clip means for resiliently gripping edgewise the wafer and retaining same within the plane of the aperture of the plate. The clip means are mounted on the support within the plane of the aperture and within the periphery thereof, and extend centrally inwardly of the aperture. At the leading edge of each clip is an arcuate portion within which the edge of the wafer is retained. In this manner the wafers are held within the support plate and are thereby protected from unwanted contact with transport means and elements of the processing apparatus, yet both faces are accessible for processing. The resilient contact between the edge of the wafer and clips provides positive positioning of the wafer and protection against sudden stops during transport and other shocks, and the assembly is readily transported from station to station. Loading and unloading is facilitated by the resilient edgewise gripping of the wafers, and is further expedited by a plurality of protruding members associated with the processing station within which the wafer support apparatus is located. Such pins are positioned to depress respective clips at a portion thereof outside the diameter of the wafers during insertion and removal thereof, precluding any abrasion of even the wafer periphery. The clips are made of round spring wire of materials and sizes chosen to support the weight of different size wafers. The plate-like support is advantageously provided with a plurality of wafer receiving apertures and associated clips, and is movable within the processing chamber to move wafers to different processing locations. The relatively thin profile of the support means with the wafer mounted therein enables a thin small volume load lock to be defined by enclosing the aperture region with sealing means. Either manual or automatic loading by simple automated equipment is equally readily accomplished with the wafer support apparatus.

These and further constructional and operational characteristics of the invention will be more evident from the detailed description given hereinafter with reference to the figures of the accompanying drawings which illustrate preferred embodiments and alternatives by way of non-limiting examples.

BRIEF DESCRIPTION OF THE DRAWINGS

FIG. 3 is a detailed perspective view of one of the plurality of clip assemblies which directly support a wafer in accordance with the present invention, showing its construction details and manner of assembly and disassembly; and FIG. 4 shows a cross-sectional elevation view of a single one of the clip assemblies of FIG. 3 in which further details of its construction and the manner by which it is removably retained are shown.

FIG. 5 shows an alternate embodiment of the clip according to the invention in top view.

FIG. 6 shows a side view of the clip of FIG. 5 along the section line 6—6.

FIG. 7 shows another side view of the clip of FIG. 5 along the section line 7—7.

DETAILED DESCRIPTION

Figure 1:
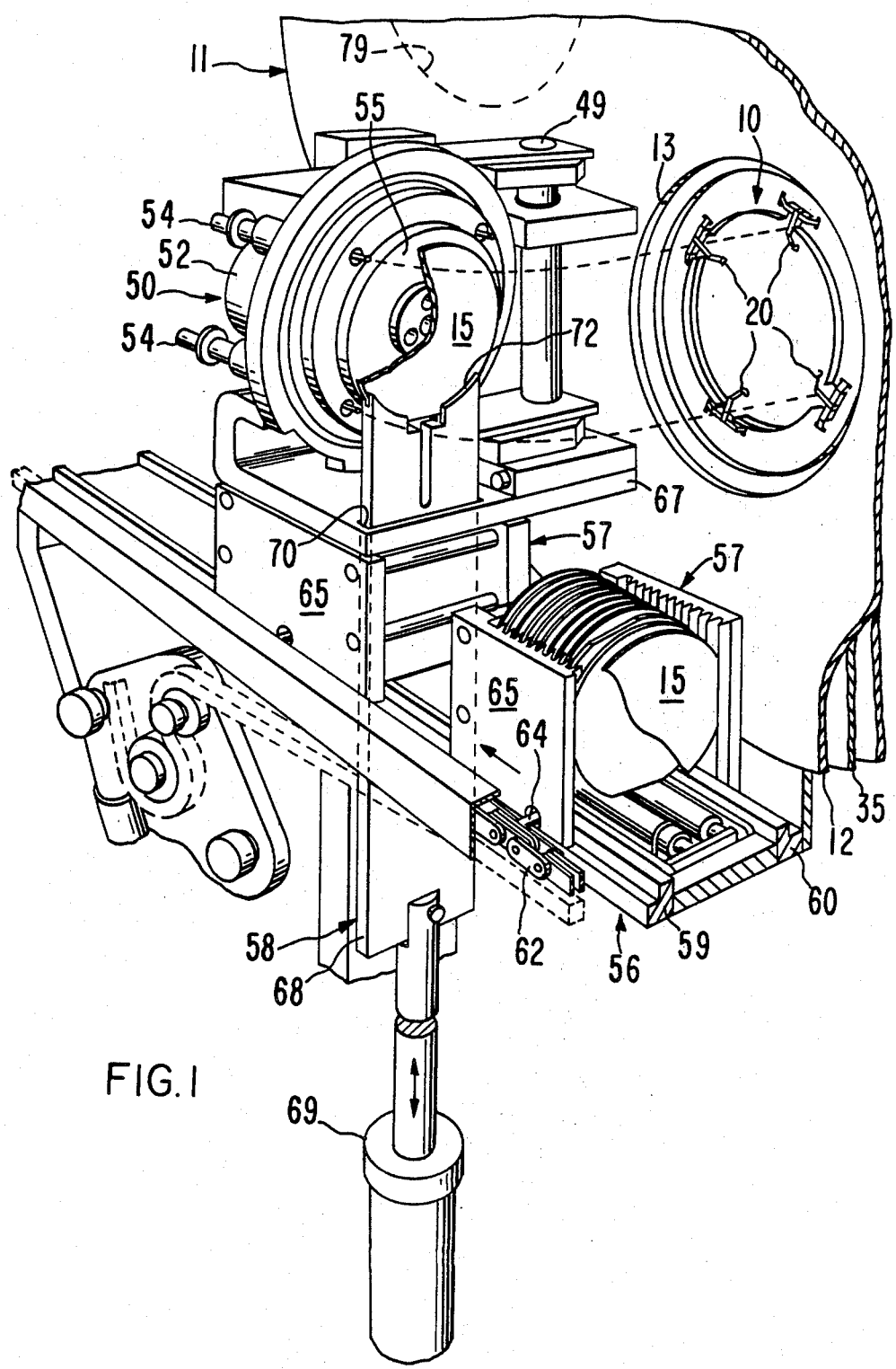
FIG. 1 is a perspective view of a complete wafer transport and loading system, showing the interaction of the wafer support assembly of the present invention with wafer loading and unloading apparatus.

The full advantages and the manner of implementation and operation of the wafer support assembly can be best appreciated by considering the invention in the illustrative context of a complete wafer loading system as shown in FIG. 1 (and more fully disclosed in the commonly assigned U.S. Pat. No. 4,311,427 of G. Coad, H. Shaw, and M. Hutchinson for "Wafer Transfer System". The wafer support assembly is shown at 10 in FIGS. 1 and 2, and it will be appreciated that assembly 10 is in this illustrative application positioned and utilized within a wafer processing apparatus or chamber 11, the vertical front wall 12 of which is shown broken away. The wafer processing apparatus or chamber 11 is meant to represent any of a number of such machines, among them semiconductor wafer coating machines, wafer etching machines, wafer lithography machines, wafer annealing machines, etc. The wafer processing or chamber 11 is provided with a chamber entrance 13 through which access to wafer support assembly 10 and the interior of the wafer processing apparatus may be had. An example of such a wafer processing apparatus in which the wafer support assembly is particularly useful may be found in the commonly-assigned copending application of Frederick T. Turner, Martin A. Hutchinson, R. Howard Shaw, and Lawrence T. Lamont, Jr., for "Wafer Coating System," Ser. No. 106,343.

Figure 2:
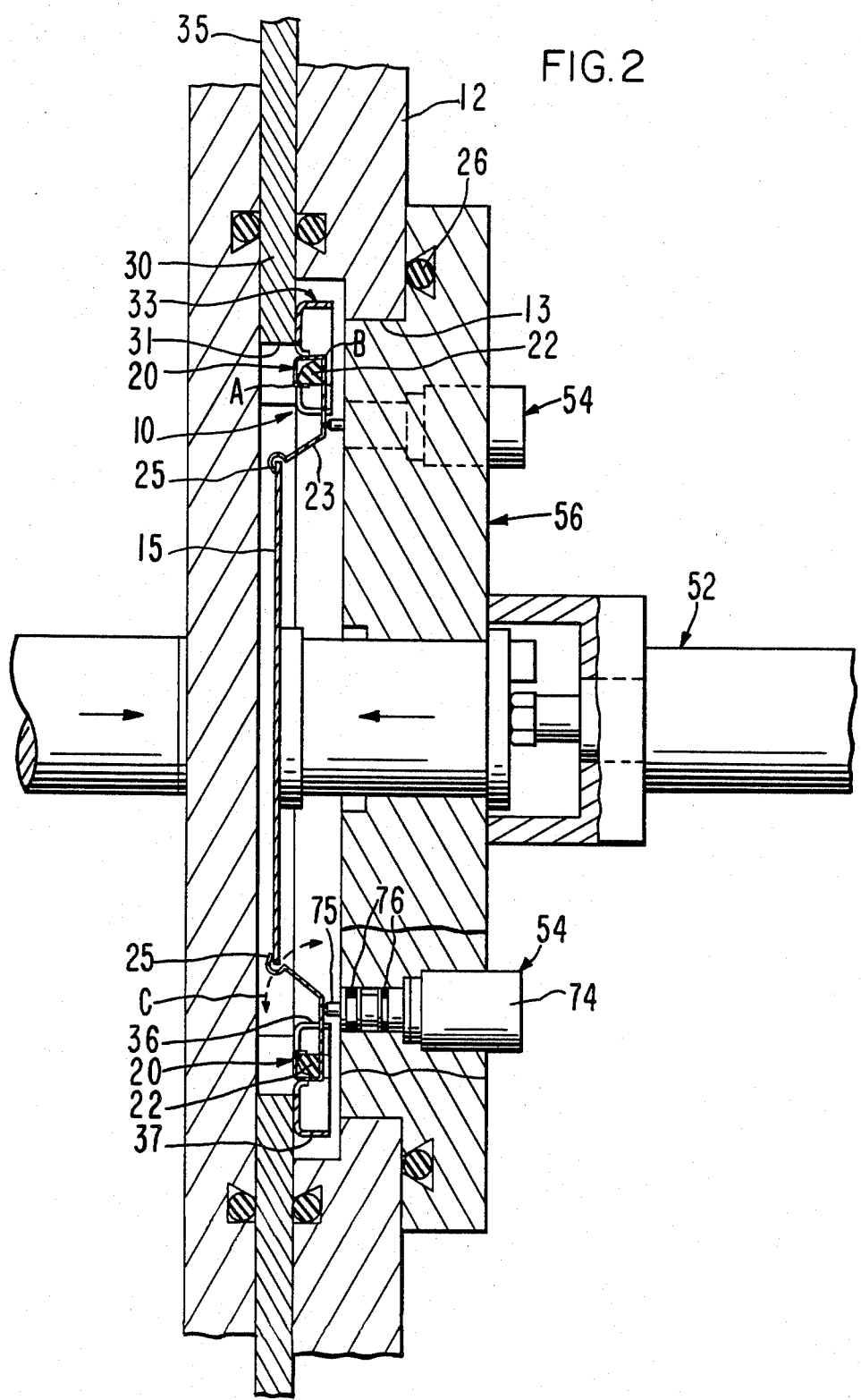
FIG. 2 is an elevational cross-sectional view of the wafer support assembly of the present invention, showing the manner in which said assembly supports a wafer inserted therein, and within the context of a load lock, and also showing the manner in which unloading of such wafer from the support apparatus is facilitated.

Within wafer support assembly 10, a wafer 15 is held edgewise and resiliently by four spaced clip assemblies, an individual one of which is shown in detail on FIGS. 3 and 4, and two of which are shown in cross-section in FIG. 2. Clip assemblies 20 include a generally rectangular, somewhat elongated block 22, which may be of insulating material, and an elongated spring arm or clip 23 firmly engaged in wraparound fashion about block 22, which is notched in a shallow manner about several faces in order to recess the clip 23 within the block and prevent any lateral movement with respect to the block. As will be especially noted from FIG. 2 this notched portion of block 22 has several faces chamfered so that contact and gripping of block 11 by clip 23 is primarily at corner points A and B, which aids in preventing the clip from twisting with respect to block 22. Each of clips 23 includes at the end thereof opposite the block an arcuate finger portion or tip 25, which is of a curvature and radius appropriate to gripping an edge of a wafer, as shown in FIG. 2.

As thus seen in FIG. 1, the four clip assemblies 20 are mounted in spaced relationship within the periphery of a circular aperture within an internal wafer support plate assembly 30 mounted within processing chamber 11. The circular aperture 31 of plate assembly 30 is of a diameter larger than the wafer, so as to accommodate both clip assembly 20 and wafer 15 therewithin. In the preferred construction shown, support plate assembly 30 comprises a wafer carrier plate 35, and a clip assembly retaining ring 33 removably attached to wafer carrier plate assembly aperture 31. Clip assemblies 20 are not directly fastened to main wafer carrier plate 35, but rather to retaining ring 33. Retaining ring 33 is of Ushaped cross-section, with lips or flanges 36 and 37 defining the inner and outer peripheries thereof, and clip assemblies 20 recessed within these flanges. Thus, clip assemblies 20, together with plate assembly 30, (including plates 35 and retainer 33), comprise wafer support assembly 10.

The manner of attachment of the clip assemblies 20 to retaining ring 33 is readily apparent from FIGS. 3 and 4. Ring 33 is provided with a set of four tabs 40 and slots 41, into which a pair of removable spring tabs 42 is inserted. Tabs 40 bear on the longitudinal sides of block 22 so as to prevent movement of the block radially inwardly or outwardly. When inserted into slots 41, spring tabs 42 bear on the ends 44 of block 22 to prevent movement of the block longitudinally, with the tabs 42 being aided by corner notches in the uppermost corner of ends 44 of the block. In this manner the clip assembly 20 is very firmly yet removably mounted upon retaining ring 33 so that no shifting is observed during operation. Yet the entire assembly may be easily dismounted for cleaning, maintenance, and periodic replacement of the clip assemblies. Note also that the flanges also serve to shield the block and associated members from the effects of certain processing steps for the wafer, especially metallization steps, wherein deposition of metal upon the block would, if the block is of insulating material, eventually negate its insulating properties. Of course, the fact that the metallic spring clips 23 terminate at block 22 means that if block 22 is made of insulating material, any wafer held by the clip assemblies is electrically isolated, a feature which can be important for certain wafer processing operations, such as R.F. sputter-etching. The manner in which each of clip assemblies is firmly yet removably held is also very readily appreciated from FIG. 4, which shows the bearing points of the spring tabs 42 in more detail, as well as the manner of notching to combat any tendency of a clip 23 to move relative to a block 22.

The form of the clips 23 may be seen in FIGS. 1 through 4 and especially in FIG. 3. Each of the clips 23 includes not only arcuate tip 25, but a proximal or near portion 46 extending from block 22, and an angled distal portion 47, which terminates in tip 25. It will be recalled that each clip assembly 20 is mounted within the periphery of aperture 31, so that the resilient force exerted on a wafer ultimately engaged by arcuate tips 25 is exerted from the edge of the wafer centrally inwardly of the wafer, which will also be held within and parallel to plate aperture 31. Proximal clip portions 46 lie within a plane closely adjacent and parallel with the plane defined by plate aperture 31. Distal portions 47 by contrast are angled down toward plane aperture 31 from portion 46, defining an obtuse angle with portions 46, as shown, so that although each clip block 22 is mounted to retaining ring 33 of plate assembly 30, each clip assembly is retained entirely within plate assembly 30. Thus the wafer itself is retained within the thickness of wafer carrier plate 35. It should be noted that the four tips 25 also lie on a circular pattern which is of a diameter somewhat less than that of a wafer 15. Thus, in order to insert a wafer, the clip 23 must be slightly spread, then allowed to rebound against the edge of a wafer to grip the wafer resiliently in an edgewise manner. A radially inwardly-acting resultant resilient force is thereby generated which helps positively retain the wafer within tips 25. Of course, wafer insertion can be accomplished by simply manually pushing the wafer by its back surface into the clips. Initially the wafer will encounter a portion of distal portion 47 near tip 25, and continued pushing will spread the clip further and allow the wafer to snap into the arcuate retaining tip 25. (Unloading may then necessitate depressing at least one of the clips to help free the wafer.)

However, it is better practice to avoid even this slight edgewise abrasion of the wafer by first spreading the clip somewhat, and then inserting the wafer. Further, it is far better to avoid all manual handling of the wafer including manual loading and unloading. The wafer support assembly is especially suitable for use with automated wafer load/unload apparatus, and in particular with a simplified and very effective such system which preserves the vertical orientation of the wafers throughout, and which is disclosed in greater detail in the above-referenced commonly assigned copending application entitled "Wafer Transport System".

It should be noted that the wafer support assembly 10 need not be oriented vertically, nor be utilized only within a processing chamber, but may also be oriented horizontally, and transported on rails or the like between processing stations and through conventional load locks. Even in these applications, support assembly 10 would continue to provide all the advantages of two-sided processing access, resilient but firm support against shocks during processing, combined with easy loading and unloading, and protection against abrasions due to the recessing of the wafer within the support assembly.

An example of a simplified apparatus for fully automating loading and unloading of wafer support assembly 10, especially when it is utilized within the present contect of a wafer processing chamber 11, is shown in FIG. 1. Attached to front wall 12 of the processing chamber by heavy-duty hinges 49 having a vertical axis is chamber door assembly 50, which as shown opens and closes in a conventional manner to intermittently seal chamber entrance 13. When fully opened to the position shown in the figure, it will be seen that the inside face of door 16 is vertical and perpendicular to the plane of chamber entrance 13, as well as wafer support assembly 10. Door assembly 50 is provided with a vacuum chuck 52, and four clip actuating means 54 whose function and operation will be more fully detailed below. Vacuum chuck 4 is positioned centrally and axially through the door so that the active end thereof forms part of the inner face 55 of the door. Chuck 52 is capable of activation to engage a wafer presented vertically to the door as shown in FIG. 1 by vacuum suction, and hold the wafer while the door is closed, whereupon the vacuum chuck axially extends from inner door face 55, whereby the wafer is engaged within the wafer support assembly 10, as will be more fully detailed below.

Extending below and on either side of chamber entrance 13 is conveyor assembly 56, which moves cassettes 57 of wafers along from the right of the entrance to left, and a cooperating wafer elevator assembly 58 for lifting wafers individually from the cassettes and upwardly to the operative end of the vacuum chuck on the inside face of door assembly 50. As may be seend from FIG. 1, conveyor assembly 56 includes a pair of rails 59 and 60 extending longitudinally across the front of the wafer processing chamber 11 and horizontally. Cassettes 57 and the spacing of rails 59 and 60 are such that the sidewalls of the cassettes straddle the rail and enable the cassette to be slideably moved along the rails across from the ends of the conveyor toward and away from wafer elevator assembly 58. Motive power for the movement of the cassettes is provided by chain drive means 62, which includes various guides and gear arrangements causing a roller chain to be moved alongside rail 59. The chain is provided at regular intevals with guide pins 64, which engage a matching cut-out at the bottom of cassette wall 65 of adjacent rail 59. Thus, the cassette is caused to move at the same rate as the chain toward elevator assembly 58.

Wafer elevator assembly 58 is positioned below and to the left side of chamber entrance 13 and includes an upper guide plate 67, a blade-like elevator member 68, and an actuating cylinder 69 connected to the lower end of member 68. Elevator blade member 68 passs through guide slot 70 and between guide rails 59 and 60 so as to move up and down in a vertical path intersecting conveyor between rails 59 and 60 at right angles and extending from below conveyor 56 to door assembly 50. As may be seen, cassette 57 is constructed to allow access from below to the wafers and to allow elevator blade member 68 to pass completely therethrough. Blade member 68 is provided with an arcuate upper end 72 shaped to match the curvature of the wafers, and a groove within this end adapted to match the thickness of a wafer.

In operation, conveyor assembly 56 moves the wafers serially in turn past wafer elevator assembly 58 and over elevator blade member 68. Elevator blade 68 then moves upwardly to engage an individual wafer 15 at its rear face, and elevator blade 58 then is lowered through guide slot 70 and the cassette to a point below conveyor 56. When the wafer processing is completed, the wafer is again presented by vacuum chuck 52 and door assembly 50 to be lowered back into the cassette, whereupon the elevator again rises to accept the wafer. The conveyor moves the cassettes in order to enable the operation to be repeated for successive wafers.

When a wafer has been thusly presented to vacuum chuck 52, a series of operations then are set into motion to load wafer 15 into wafer support assembly 10, as mentioned previously. The details of the loading and unloading of a wafer into wafer support assembly 10 may be best appreciated from FIG. 2 taken with FIG. 1. FIG. 2 shows vacuum chuck 52 in its extended position and clip actuating means 54 also in their extended position; this will occur either just prior to the completion of insertion of a wafer into the processing chamber 11, or at the beginning of unloading of a wafer once processing thereof is completed; in both instances door 50 will be in its closed position sealing off chamber entrance 13 from the atmosphere.

One of the clip actuating means 54 is shown in detail toward the lower end of FIG. 2, and includes a pneumatic cylinder 74, a contact pin 75 which moves axially inwardly and outwardly, and is propelled by cylinder 74, and axial seals 76 for the pin. Each of the four means 54 is positioned within and through door 50 so as to be in registration with a corresponding one of clip assemblies 20 when the door 50 is in its closed position, pins 75 are positioned in registration with the flat proximal portions 46 of clip assembly 20, and are extended just prior to the insertion of a wafer or its withdrawal. The pressure of pin 75 against clip proximal portion 46 thereupon depresses the clip and causes tip 25 to swing back and outwardly along the path C shown in FIG. 2 in curved broken line. Note that other means besides the pin-oriented depression action described above could be utilized to activate the clips and facilitate wafer insertion and removal. For example, a ring could be driven axially and simultaneously against all the flat portions 46 of the clips, to depress and spread same, giving the same clip-actuating action as the illustrated means.

Vacuum chuck 52 then positions the wafer centrally within the plane of plate aperture 31, whereupon cylinder 74 is deactivated, and the pins withdrawn. Thereupon the clips snap back to their original undeflected position, and tips 25 engage the edges of wafer 15, holding the wafer securely during any processing.

Note that plate assembly 30 may be moved about within processing apparatus 11 to a plurality of processing stations and may be provided with further apertures, as for example shown at 79, and further sets of clip assemblies therefor to thereby carry additional wafers. For further details of processing apparatus utilizing the wafer support system of the present invention and disclosing such a multi-station processing apparatus, refer to the aforementioned copending application for "Wafer Coating System."

Upon completion of the processing, the wafer is again in registration with chamber entrance 13, and door assembly 50 is sealed over chamber entrance 13. Again vacuum chuck 52 is activated to engage the rear face of wafer 15, whereupon the cylinder 74 of each clip actuating means 54 drives each pin 75 against a flat proximal portion 46 of a clip assembly. This forces each arcuate tip 25 away from engagement with the edge of the wafer, whereupon vacuum chuck 52 withdraws wafer 15 toward the inner surface of door 50 and out of the neighborhood of the clip assemblies 20 without any abrasion, even of the edges of the wafer. Door 50 is then opened to deliver the completed wafer into position over elevator blade member 68, which then lowers the wafer back into the cassette.

It should be noted that there are many applications in which it is not necessary to provide access for processing purposes to the back faces of the wafers. In at least some of these applications, it may not be feasible to load the wafers into the wafer support means while engaging the back face of a wafer with a wafer pickup means such as vacuum chuck 52. Yet it may be desirable to employ individual clip means similar to clip assembly 20 actuated by a means similar to clip actuating means 54 in order that the wafers may be supported positively and resiliently edgewise, with minimal abrasion of and damage to the edges of the wafers during loading and unloading. In such application it may be desirable to present the individual wafers to the clip means using a wafer pickup means which engages the front face of the wafer. Although the wafer pickup means could be similar to vacuum chuck 52, which engages the wafer face firmly by vacuum suction, it is preferable, in the interest of avoiding damage to the delicate microcircuits contained in the front face of the wafer, that the wafer pickup means be non-contacting. One such pickup means known in the art as a "Bernoulli air" pickup head employs the flow of a suitable gas, such as air or nitrogen, between the pickup head and the face of the wafer. To avoid contamination of the wafer by dust particles and the like, the flowing gas must be scrupulously clean and, preferably, dry.

Alternative arrangements may be more suited to certain applications. In the apparatus shown in FIG. 2, the wafers are loaded individually from the rear into the clip means. In some applications it may be desired instead to load wafers from the front into the same or similar clip means. This can clearly be accomplished with straightforward apparatus modifications. One requirement is that clip actuating means be employed to open and close the clips to permit wafer loading and unloading without damage to the wafer. A front face pickup means, such as the aforementioned Bernoulli air pickup head, may be advantageously employed to engage the front faces of the wafers for transporting them and for loading them into and unloading them from the clip means. In this type of alternative arrangement, the aperture into which the wafer is recessed in the preferred embodiment could be absent altogether, or of diameter smaller than the wafer; or alternatively could be a recess rather than a completely-defined aperture through the adjacent clip support. Yet such alternative arrangements would enjoy most if not all of the advantages of the illustrated embodiment, including positive and resilient edgewise support, having access to at least one entire face, fast loading and unloading, compatibility with automated loading and unlaading, ease of loadlocking, tolerance of diameter and orientation variations, and protection against shocks.

Clips of the prior art as exemplified by U.S. Pat. No. 4,306,731 are made of flat strip material. Such clips are hard to manufacture, are inherently highly stressed and are easily weakened. According to the invention, the clips are made of spring stock with a round cross-section.

Round cross-section clips have many advantages over the prior art. They are easier to form and stronger, making it possible to hold larger wafers. Round cross-section clips can be made of wire having higher temperature tolerance and have the equivalent or better spring properties than prior art clips. Heavier wafers can be accommodated using larger stock. The working deflection of the wire clip can be increased over the prior art clips. Above all, the use of round stock enables many more degrees of freedom in the mode of deflection of the clip.

The actuation mechanism of the wire clip, according to the invention, can move the wire clip out of the way in two planes at the same time to allow loading the wafer either axially, as in the prior art, or parallel to its own plane in the held position. This simplifies loading since loading can be done, in an alternate embodiment of the machine, directly from the bottom of the machine, and need not employ a vacuum pickup, wafer load door and associated mechanism. Furthermore, clip can be made larger and the actuation point can be moved further from the wafer, thereby enabling movement of the clip away from the wafer faster, reducing heat transfer and making it easier to provide shielding to the actuation mechanism.

FIGS. 5–7 show an alternate embodiment of the clip using spring wire according to the invention in which the clip 100 has an arcuate portion 102, a straight distal portion 104, a proximal portion 106 at right angles to the distal portion 104. The prxximal portion passes through pins 108 and 110 and after a right angle bend through pins 114 and 114. The clip 100 is held to the block 116 of insulating material with a clamp 118 by means of one or more screws 120. The block 120 can be fastened to the ring 33 with screws 122 as shown or with spring clips 42 as shown in FIG. 3.

In use, a first actuator 124 moves the arcuate tip 25 away from the wafer. If it is desired to move the clip out of the way of the wafer for loading in the plane of the wafer as previously described, a second actuator 126 be used to move the clip 100 out of the plane of the wafer. In another embodiment, a rotary actuator with an eccentric cam can be used to move the clip first away from the wafer and then out of the plane by the wafer.

This invention is not limited to the preferred embodiments and alternatives heretofore described, to which variations and improvements may be made including mechanically and electrically equivalent modification, changes and adaptations to component parts, without departing from the scope of production of the present patent and true spirt of the invention, the characteristics of which are summarized in the appended claims.

What is claimed is:

1. Wafer support means for retaining an individual wafer therein, comprising:

at least three clip means for resiliently gripping edgewise said wafer;

each of said clip means being spaced apart from each other and aligned in a first generally circular pattern of diameter greater than said wafer, the angular spacing between adjacent ones of said clip means being less than 180 degrees;

each of said clip means having a resilient wire arm extending generally central inwardly of said circular pattern;

each of said clip means extending in the direction transverse to that of said circular pattern a distance which is small relative to the diameter of said circular pattern;

each of said clip means having at the end of said resilient arm nearest said center a finger portion opening generally centrally inward, said finger portions lying in a second circular pattern of diameter somewhat less than that of said wafer, said finger portion being arcuate in form;

said finger portion engaging the edge of said wafer to be retained therein and exerting resilient pressure centrally inwardly on said wafer;

said arms defining a portion depressible to facilitate acceptance and removal of said wafer;

each said resilient wire arm including a distal portion nearest said center, terminating in said finger portion, and a proximal portion, said proximal portion being straight and at a right angle to said distal portion comprising said depressible portion, and lying generally in a plane parallel with the plane defined by said first circular pattern;

two actuator means placed in proximity of each said clip for actuating each said clip in orthogonal directions;

whereby a relatively thin support means is provided into which said individual wafer may be rapidly inserted and removed and while retained therein, transported and accessed on both sides for processing.

2. Wafer support means as in claim 1 wherein each of said clip means further includes a clip support means anchoring the end of said resilient arm opposite said finger portion, said clip support means being made of an insulating material, whereby a wafer retained within said clip means is electrically isolated.

3. Wafer support means as in claim 1 in which is further included support plate means defining an aperture, the periphery of said aperture comprising said first circular pattern, each of said clip means being attached about said periphery of said aperture in spaced relationship.

* * * * *